United States Patent
Gambetta et al.

(10) Patent No.: US 9,059,707 B2
(45) Date of Patent: Jun. 16, 2015

(54) QUANTUM CIRCUIT WITHIN WAVEGUIDE-BEYOND-CUTOFF

(71) Applicants: Jay M. Gambetta, Yorktown Heights, NY (US); Chad T. Rigetti, Brooklyn, NY (US)

(72) Inventors: Jay M. Gambetta, Yorktown Heights, NY (US); Chad T. Rigetti, Brooklyn, NY (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 13/969,780

(22) Filed: Aug. 19, 2013

(65) Prior Publication Data

US 2014/0167836 A1    Jun. 19, 2014

Related U.S. Application Data

(63) Continuation of application No. 13/713,759, filed on Dec. 13, 2012.

(51) Int. Cl.
*H03K 17/92* (2006.01)
*H03K 19/195* (2006.01)

(52) U.S. Cl.
CPC .............. *H03K 19/195* (2013.01); *H03K 17/92* (2013.01)

(58) Field of Classification Search
USPC .................................. 326/3, 2; 327/528, 527
See application file for complete search history.

(56) References Cited

U.S. PATENT DOCUMENTS

| | | |
|---|---|---|
| 6,347,237 B1 | 2/2002 | Eden et al. |
| 6,563,311 B2 | 5/2003 | Zagoskin |
| 7,253,654 B2 | 8/2007 | Amin |
| 7,418,283 B2 | 8/2008 | Amin |
| 7,529,717 B2 | 5/2009 | Vala et al. |
| 7,546,000 B2 | 6/2009 | Spillane et al. |
| 7,560,726 B2 | 7/2009 | Beausoleil et al. |
| 7,601,946 B2 | 10/2009 | Powers et al. |
| 7,932,514 B2 | 4/2011 | Farinelli et al. |
| 8,441,329 B2 | 5/2013 | Thom et al. |
| 8,536,566 B2 | 9/2013 | Johansson et al. |
| 2011/0152104 A1 | 6/2011 | Farinelli et al. |
| 2014/0167836 A1* | 6/2014 | Gambetta et al. ............. 327/528 |

OTHER PUBLICATIONS

Hoffman, J.E. et al., "Atoms Talking to SQUIDs", Sep. 23, 2011, located at: http://arxiv.org/pdf/1108.4153v2.pdf>, 17 pages.
PCT (Patent Cooperation Treaty), Notification of Transmittal of the International Search Report and the Written Opinion of the International Searching Authority, International Application No. PCT/US2013/056987, Mailed Feb. 19, 2014, 11 pages.
PCT(Patent Cooperation Treaty), Written Opinion of the International Searching Authority, International Application No. PCT/US2013/056987, Mailed Feb. 19, 2014, 7 pages.
Popovic, Zoya et al., "Introductory Electromagnetics", Chapter 23, ISBN 0-201-32678-7, 2000, located at:http:ecee.colorado.edu/~ecen3400/Chapter%2023%20-%20Waveguides%20and%20Resonators.pdf, pp. 432-456.

(Continued)

*Primary Examiner* — Daniel D Chang
(74) *Attorney, Agent, or Firm* — Cantor Colburn LLP; Vazken Alexanian

(57) ABSTRACT

A quantum information processing system includes a waveguide having an aperture, a non-linear quantum circuit disposed in the waveguide and an electromagnetic control signal source coupled to the aperture.

12 Claims, 3 Drawing Sheets

(56) References Cited

OTHER PUBLICATIONS

Rigetti, Chad et al., "Superconducting Qubit in Waveguide Cavity with Coherence Time Approaching 0.1ms", Cornell University Library, Physical Review B. vol. 86. No. 10, 2012, located at: http://arxiv.org/pdf/1202.5533.pdf>, 5 pages.

P. Bertet et al., "Dephasing of a Superconducting Qubit Induced by Photon Noise," Phys. Rev. Lett., vol. 95, 2005, 257002, 4 pages.

A. Blais et al., Cavity quantum electrodynamics for superconducting electrical circuits: an architecture for quantum computation," Phys. Rev. A, vol. 69, 2004, 062320, 14 pages.

L. DiCarlo et al., "Demonstration of two-qubit algorithms with a superconducting quantum processor," Nature, vol. 460, 2009, pp. 240-244.

J. Gambetta et al., "Qubit-photon interactions in a cavity: Measurement-induced dephasing and number splitting," Phys. Rev. A, vol. 74, 2006, 042318, 14 pages.

M. D. Reed et al., "Fast reset and suppressing spontaneous emission of a superconducting qubit," Appl. Phys. Lett., vol. 96, 2010, 203110, 3 pages.

M. Steffen et al., "High-Coherence Hybrid Superconducting Qubit," Phys. Rev. Lett., vol. 105, 2010, 100502, 4 pages.

P. Jones et al., "Highly controllable qubit-bath coupling based on a sequence of resonators," Journal of Low Temperature Physics, vol. 173, No. 3-4, 2013, pp. 152-169.

R. Rafique et al., "Niobium Tunable Microwave Filter." IEEE Transactions on Microwave Theory and Techniques, vol. 57, No. 5, 2009, pp. 1173-1179.

S. Srinivasan et al., "Tunable coupling in circuit quantum electrodynamics using a superconducting charge qubit with a V-shaped energy level diagram," Physical Review Letters, vol. 106, No. 8, 2011, 083601, 4 pages.

Y. Yin et al., "Catch and release of microwave photon states," Physical Review Letters, vol. 110, No. 10, 2013, 107001, 5 pages.

* cited by examiner

QUANTUM CIRCUIT WITHIN WAVEGUIDE-BEYOND-CUTOFF

CROSS-REFERENCE TO RELATED APPLICATION

This application is a continuation of U.S. patent application Ser. No. 13/713,759, filed Dec. 12, 2012, the disclosure of which is incorporated by reference herein in its entirety.

BACKGROUND

The present invention relates to quantum electronic circuits for applications to quantum information processing and more specifically to systems and methods for implementing and operating such devices by embedding a superconducting circuit within a waveguide-beyond-cutoff (WBC).

An electronic quantum circuit for quantum information processing must be sufficiently isolated from the electromagnetic (EM) environment that its quantum coherence can persist a useful length of time, yet still interact with the external world so it can be controlled and measured. The physical sizes and coupling strengths typically realized in superconducting quantum circuit devices favor strong interactions with the external environment over isolation, so they tend towards being straightforward to control and measure but difficult to isolate from uncontrolled degrees of freedom in the surrounding EM environment. Several methods have previously been developed to enhance the attainable degree of isolation of the quantum degree of freedom of interest, such as exploiting symmetries in the circuit Hamiltonian and engineering the eigenstate energy spectrum with respect to charge and flux.

A quantum electronic circuit having a transition frequency $\omega$ loses energy to the environment, described by an admittance $Y(\omega)$, at the rate:

$$\kappa_q = 1/T_1(\omega) = Re[Y(\omega)]/C_q \qquad (\text{Eq. 1})$$

where $Y(\omega)$ is the admittance as seen by the mode of the quantum circuit at frequency $\omega$; $T_1$ is the energy decay time, and $C_q$ is the characteristic capacitance of the mode. One important objective in the design and development of quantum circuits for applications to quantum information processing is the minimization of this relaxation rate. One tool for doing this involves coupling the non-linear quantum circuit (qubit) to the environment through a linear resonator. This approach, called circuit Quantum Electrodynamics, or circuit QED, has emerged over the past decade to become the standard paradigm for the design and operation of superconducting quantum circuits. The filtering action of the environment impedance facilitates longer coherence at frequencies sufficiently far from the resonator frequency. It also favors more stable device operation, as fluctuations of the environment modes are also filtered. Further, the linear resonance mode acts as a mechanism to allow projective quantum measurement of the state of the non-linear circuit.

In the circuit QED geometry, the qubit may still lose energy to the environment via off-resonant or dispersive energy relaxation via the resonator mode, a process referred to as Purcell effect relaxation. The limit on quantum circuit relaxation rates presented by this effect is set by the quantum circuit frequency and the degree of anharmonicity of its energy level spectrum; the resonator frequencies (including possible spurious higher modes), and the couplings between them.

In circuit QED measurement of the qubit state is accomplished by exploiting the coupling between the qubit and the resonator: excitations of the qubit induce a qubit-state-dependent pull of the cavity frequency. The inverse effect, where, cavity photon number fluctuations pull the qubit frequency, leads to a dephasing process of the qubit that can suppress qubit phase coherence time $T_2$ below the limit of $2T_1$ set by energy relaxation. Minimizing this and other pure dephasing mechanisms is a second design goal for superconducting quantum circuits.

SUMMARY

Exemplary quantum information processing system, including a waveguide having an aperture, a non-linear quantum circuit disposed in the waveguide and an electromagnetic control signal source coupled to the aperture.

Additional exemplary embodiments include a quantum circuit system, including a superconducting waveguide having an aperture, a dilution refrigerator thermally coupled to the waveguide, a superconducting circuit disposed in the waveguide, and an electromagnetic field source coupled to the aperture.

Additional exemplary embodiments include a quantum information processing system, including an evanescent waveguide filter, a superconducting circuit disposed within the evanescent waveguide filter, a plurality of apertures on the waveguide, and electromagnetic field sources connected to the apertures.

Additional exemplary embodiments include a quantum information processing system, including a superconducting evanescent waveguide filter, a quantum circuit disposed within the superconducting evanescent waveguide filter, a plurality of apertures coupled to the evanescent waveguide filter and a plurality of electromagnetic field sources coupled to the plurality of apertures.

Additional exemplary embodiments include a quantum circuit system, including a superconducting waveguide having an aperture, a non-linear superconducting quantum circuit disposed in the superconducting waveguide and an electromagnetic field source coupled to the aperture.

Further exemplary embodiments include a quantum information processing method, including positioning a non-linear quantum circuit in a waveguide having an aperture and coupling an electromagnetic field source to the aperture.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein embed a non-linear quantum circuit within the otherwise empty interior volume of a waveguide transmission line. Waveguides are characterized by a cutoff wavelength (frequency) below (above) which EM signals may propagate along the guide but above (below) which fields within the guide are evanescent and are attenuated exponentially with distance along the guide's propagating axis. In exemplary embodiments, a quantum circuit operates at a frequency below the cutoff frequency of the waveguide. The evanescent guide then acts as an ideal filter, completely removing interactions with the external environment. It does so without adding a dephasing channel through photon induced dephasing as in circuit QED.

In exemplary embodiments, the systems and methods described herein remove dephasing mechanisms and drastically reduce the Purcell effect by embedding the quantum circuit within an evanescent mode waveguide. At frequencies below the cutoff waveguide cutoff frequency the external EM environment is perfectly filtered. Further, there are no auxiliary modes coupled to the quantum circuit for stray photons to occupy or pass through to generate a dephasing process.

In order to realize control and measurement of the quantum circuit, EM signals are introduced through an aperture in a wall of the waveguide proximal to the location of the quantum circuit. Signals applied to the aperture at frequencies below cutoff produce evanescent fields which do not propagate along the guide but nonetheless couple to the quantum circuit.

In exemplary embodiments, the systems and methods described herein implement a quantum circuit in a waveguide beyond cutoff arrangement, which produces, among several other benefits, lower rates of energy relaxation and decoherence. In exemplary embodiments, a quantum circuit is embedded within a section of waveguide whose lateral dimensions are chosen such that the waveguide cutoff frequency (the lowest frequency at which the waveguide transmits) is greater than the transition frequency of the quantum circuit.

The quantum circuit may be produced by standard lithographic micro-fabrication techniques. The waveguide may be produced by machining from bulk metal or bulk superconductor such as aluminum, copper, or alloys thereof. The EM signals may be delivered to the aperture by a coaxial feedline.

Figure 1:
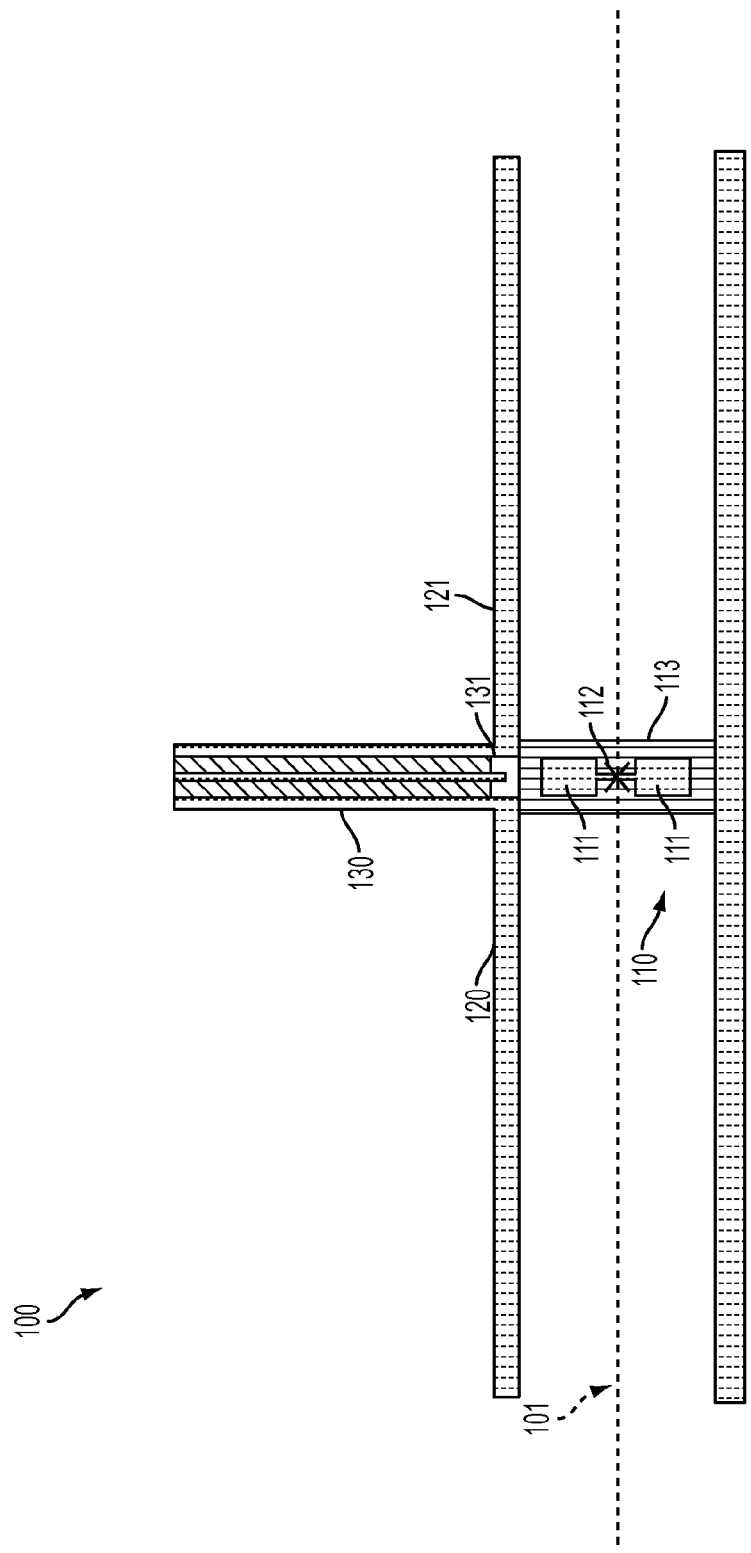
FIG. 1 illustrates a schematic diagram of an exemplary quantum circuit system.

FIG. 1 illustrates a schematic diagram of an exemplary quantum circuit system 100. The system 100 is an exemplary realization of the WBC implementing a quantum circuit. In exemplary embodiments, the system 100 includes a quantum circuit 110, which can be a transmon superconducting qubit, comprising a two capacitive pads 111 separated by a wire interrupted at its midpoint by a single Josephson junction 112. In this example, the quantum circuit 111 is lithographically patterned on sapphire substrate 113. The quantum circuit 110 is secured within a section of a waveguide 120 and controlled through the evanescent fields induced within the waveguide 120 by driving a coaxial feedline 130.

Figure 2:
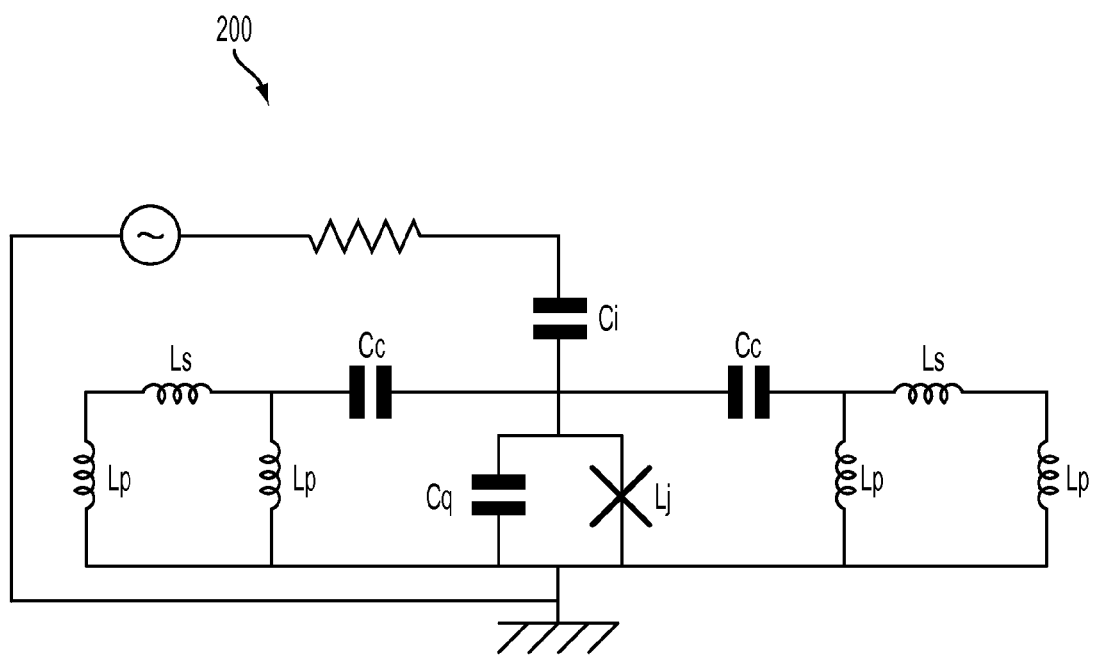
FIG. 2 illustrates a schematic diagram of an equivalent circuit of the quantum circuit system of FIG. 1.

FIG. 2 illustrates a schematic diagram of an equivalent circuit 200 of the quantum circuit system 100 of FIG. 1. Values of the series inductances Ls, and parallel inductances Lp describing the WBC as seen by the quantum circuit 110 are determined by the length and dimensions of the waveguide 120. The capacitances Ci, Cc are determined by the geometry of the coaxial feedline 130 and the profile of the evanescent fields that the coaxial feedline 130 produces inside the waveguide 120 when driven by the external source. The quantum circuit parameters $C_q$ and $L_j$ are determined by the geometry and fabrication parameters of the quantum circuit 110. As such, it will be appreciated that the equivalent circuit 200 enables modeling the WBC design. In exemplary embodiments, the waveguide can have any geometric cross section including but not limited to rectangular, circular, elliptical, or any other suitable shape.

Because the real part of the impedance of a waveguide is zero at $\omega<\omega_c$, energy and information stored in the qubit cannot escape to the environment As a result, to first order the quantum circuit is completely decoupled from its environment. This observation is in contrast with the circuit QED architecture, where the Purcell effect at a particular qubit-resonator detuning is suppressed only in proportion to the quality factor of the resonator, as this sets how strongly the dissipative environment is filtered by the resonator. Further, because the quantum circuit 110 is not strongly coupled to a resonator mode as in circuit QED, the physical mechanism underlying cavity-induced de-phasing is also removed. Though the section of the WBC 120 in which the quantum circuit 110 is disposed, is of finite length and thus would in principle have resonant modes, such resonances are constrained to those modes and frequencies supported by the WBC 120, and must have frequencies at or above the cutoff frequency.

The inherently simple geometry of a waveguide design likewise eliminates decoherence due to photon number fluctuations in resonant modes of the enclosure, as the WBC provides a modeless environment.

A small aperture 131 in a side wall 121 of the WBC 120, proximal to the physical location of the quantum circuit 110, is implemented to deliver control signals to the quantum circuit 110. The aperture 131 may be penetrated by the coaxial feedline 130 (e.g., a coaxial transmission line or the center conductor of a coaxial transmission line). In other exemplary embodiments, the aperture 131 may act as an aperture-coupler to another waveguide. From the aperture 131, control signals are coupled to the quantum circuit 110 through the evanescent fields they produce inside the walls of the WBC 120. In exemplary embodiments, the waveguide 120 can include multiple apertures.

Referring still to FIGS. 1 and 2, a structure is now described as a specific physical realization of the system 100. It will be appreciated that many other types of physical realizations are contemplated in other exemplary embodiments. In the example, the quantum circuit 110 is a single-junction transmon type superconducting quantum circuit (a dipole antenna 111 patterned on thin-film aluminum-on-sapphire or silicon substrate 113 and interrupted at its midpoint with a single Josephson junction 112) embedded within a 12 centimeter (cm) section of waveguide (i.e., WBC 120) machined from (superconducting) aluminum alloy 6061. The lateral interior dimensions of the WBC 120 are 4 mm×7 mm and the WBC 120 has a cutoff frequency of f_c=21.4 GHz. The quantum circuit 110 has an operating frequency in the 8-10 GHz range. The broad wall (i.e. side wall 121) of the WBC 120 is penetrated by a 0.086" o.d. coaxial cable (i.e., the coaxial feedline 130) whose outer conductor is in good contact with the side wall 121. The center conductor protrudes into the WBC 120. The entire WBC 120 can be placed on a dilution refrigerator for test and characterization at or near a temperature of 10 mK.

Propagating EM fields oscillating at any frequency below $\omega_c$ are not supported by the WBC 120 and such fields are attenuated exponentially along a longitudinal axis 101 of the WBC 120. Referring again to the equivalent section 200 of FIG. 2, the 12 cm section of the WBC 120 in the example acts as a purely inductive pi-section filter where the effective series inductance, Ls, increases exponentially with the physical length of the section of the WBC 120 being modeled.

By implementing the WBC 120, the quantum circuit 110 (e.g., a qubit) has no means of releasing its energy to the environment external to the WBC 120, to first order (i.e., the real part of the admittance, Y, seen by the quantum circuit 110 is 0). In addition, the quantum circuit 110 is not explicitly coupled to a resonator mode of the WBC 120 in this configuration, which helps prevents a known dephasing mechanism present in circuit QED. In FIG. 1, by introducing the coaxial feedline 130 into the WBC 120, the quantum circuit 110 can release its energy to the coaxial feedline 130. The coupling between coaxial feedline 130 and the quantum circuit 110 can be made increasingly small such that energy loss via the coaxial feedline 130 can be made vanishingly small while still coupling externally produced control signals to the quantum circuit with sufficient strength to induce transitions between its eigenstates.

In exemplary embodiments, the quantum circuit 110 may be controlled by the application to the guide of multi-tone signals at $\omega > \omega_c$ where the frequency difference between the tones is selected to induce transitions via second order stimulated Raman transitions. In this process, the quantum circuit 110 is driven at two frequencies $\omega_1$ and $\omega_2$ simultaneously. Both frequencies are above the cut-off frequency of the waveguide and satisfy $|\omega_1 - \omega_2| \sim \omega_q$ where $\omega_q$ is the quantum circuit 110 transition frequency.

Measurement of the state of the quantum circuit 110 can be realized using a single tone below cutoff or multiple tones above cutoff. In particular it is possible to ascertain the state of the quantum circuit by observing the response to a drive signal tuned to the 0→3 transition (with frequency $\omega_{03}$). If and only if the qubit is in the ground state 0 will the system undergo a driven cycling transition. This transition of the quantum circuit 110 may be above or below $\omega_c$.

Alternatively, if the aperture is proximal to the quantum circuit, observing the phase of a signal reflected from the aperture at frequency $\omega_r$ such that $\omega_{12} < \omega_r < \omega_{01}$ or $\omega_{12} > \omega_r > \omega_{01}$ will contain information about the state of the qubit.

Figure 3:
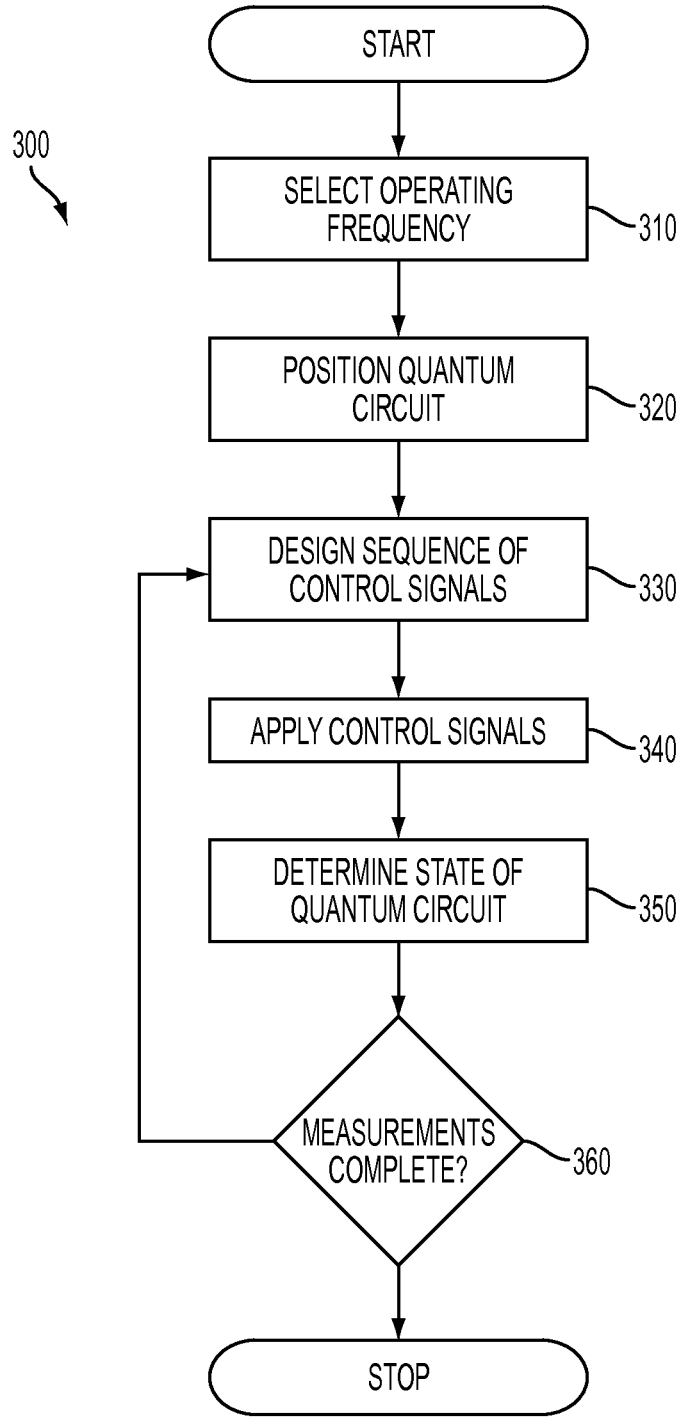
FIG. 3 illustrates an overall method for operating a quantum circuit in accordance with exemplary embodiments.

FIG. 3 illustrates an overall method 300 for operating a quantum circuit in accordance with exemplary embodiments. At block 310, a quantum circuit is selected based on its operating frequency $\omega_{01}$. The frequency has been previously established either by measuring the device directly using conventional cQED techniques and 3D microwave cavities, or is inferred by measuring its properties in the normal state, possibly at room temperature, or otherwise determining its frequency $\omega_{01}$. At block 320, a quantum circuit (e.g., the quantum circuit 110) is then positioned in a WBC 120. As described herein, the waveguide is dimensioned such that the cutoff frequency is significantly greater than the operating frequency $f_{01}$ of the quantum circuit. As such, at block 320, the operating frequency of the quantum circuit is selected well below the cutoff frequency of the waveguide. At block 330, a sequence of control signals is designed at frequencies $\omega_1$ and $\omega_2$ such that their sum is greater than the cut-off frequency, and the difference of f1 and f2 is close to or equal to $\omega_{01}$. By selecting appropriate duration and amplitude of the control signals at $\omega_1$ and $\omega_2$, the state of the quantum circuit can manipulated. At block 340, subsequent application of this sequence manipulates the state of the quantum circuit. At block 350, the state of the quantum circuit is measured by applying a control signal at frequency $f_{03}$ and detecting the transmission of this signal through the waveguide. Depending on the state of the quantum circuit, the transmitted signal is modulated in phase and/or amplitude. At block 360, it is determined if all measurements are complete. If all measurements are complete at block 360, then the method 300 continues at block 330. Based on the measurement result, a new sequence of control sequence can be designed to realize different operations. Once measurements are completed and all measurements are taken at block 360, the method stops.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A quantum information processing method, comprising:
   positioning a non-linear quantum circuit in a waveguide having an aperture;
   coupling an electromagnetic field source to the aperture, wherein a coaxial transmission line couples the electromagnetic field source to the aperture, the coaxial transmission line applying electromagnetic fields to the aperture to generate evanescent fields inside the waveguide.

2. The method as claimed in claim 1 wherein the waveguide includes a cutoff frequency $\omega_c$ such that the waveguide does not support propagating electromagnetic waves for frequencies $\omega_s$ below $\omega_c$.

3. The method as claimed in claim 2 wherein the non-linear quantum circuit disposed in the waveguide has a discrete spectrum of energy eigenstates.

4. The method as claimed in claim 3 wherein the two lowest-lying energy eigenstates of the quantum circuit disposed in the waveguide differ in energy by $\omega_{01}$ such that $\omega_{01} < \omega_c$.

5. The method as claimed in claim 4 wherein the waveguide is superconducting waveguide.

6. The method as claimed in claim 5 wherein the quantum circuit includes a Josephson junction.

7. The method as claimed in claim 5 wherein the non-linear quantum circuit is instantiates at least one of a quantum bit, and qubit.

8. The method as claimed in claim 1 wherein a center conductor of the coaxial transmission line penetrates the aperture;
wherein an outer conductor of the coaxial transmission line contacts a side wall of the waveguide.

9. The method as claimed in claim 8 wherein the evanescent fields provide control signals to the non-linear quantum circuit.

10. The method as claimed in claim 2, wherein the electromagnetic field source is configured to apply signals to the aperture at frequencies $\omega_s < \omega_c$.

11. The method as claimed in claim 1 wherein the electromagnetic field source is coupled to the aperture via a coaxial transmission line.

12. The method as claimed in claim 1 wherein the electromagnetic field source is coupled to the aperture via a waveguide.

* * * * *